United States Patent [19]

Agarwala et al.

[11] Patent Number: 5,223,480

[45] Date of Patent: Jun. 29, 1993

[54] METHOD OF PREPARATION OF SILVER COMPOSITE HIGH TEMPERATURE CERAMIC SUPERCONDUCTORS BY PRECIPITATION

[75] Inventors: Ashok K. Agarwala, Penfield; Paul A. Christian, Pittsford; Kenneth B. Quinn, Rochester, all of N.Y.

[73] Assignee: Eastman Kodak Company, Rochester, N.Y.

[21] Appl. No.: 689,226

[22] Filed: Apr. 22, 1991

[51] Int. Cl.$^5$ ............... C01F 11/02; C01G 3/02
[52] U.S. Cl. .................... 505/1; 419/19; 419/20; 419/21; 419/22; 423/604; 423/635; 505/737; 505/738; 505/785
[58] Field of Search .......... 505/1, 737, 738, 781, 505/785; 419/10, 19, 20, 21, 22; 423/604, 635

[56] References Cited

U.S. PATENT DOCUMENTS 4,839,339  6/1989  Bunker et al. .
5,071,826 12/1991  Anderson .................... 505/785

FOREIGN PATENT DOCUMENTS 0138125  5/1989  Japan .................... 505/738
0212221  8/1989  Japan .................... 585/737
0137706  5/1990  Japan .................... 505/738

OTHER PUBLICATIONS

Wang et al. "Comparison of Carbonite, Citrate, Oxalite . . ." *Inorg. Chem.* vol. 26 1987 pp. 1474–1476.
Carim et al. "Nanocrystalline yttrium barium . . ." *Mat. Lett.* vol. 8(9) pp. 335–339 1989 (Abstract only).
Cukauskas et al. "The properties of yttrium . . ." *J. Appl. Phys.* vol. 67(11) 1990 pp. 6946–6952 (Abstract only).

*Primary Examiner*—Paul Lieberman
*Assistant Examiner*—John Boyd
*Attorney, Agent, or Firm*—Stephen C. Kaufman

[57] ABSTRACT

A novel method for forming homogeneous silver high temperature superconductor (HTS) composites. The novel method comprises a chemical coprecipitation of silver, barium, yttrium, and copper salts solutions, followed by calcination and milling processes. The novel method has an advantage of retaining all the virtues immanent in a composite HTS, for example, increased critical current density (Jc), and improved mechanical properties, while bypassing extant and deficient methodologies for forming a composite, the deficient composites characterized by heterogeneity.

3 Claims, 5 Drawing Sheets

METHOD OF PREPARATION OF SILVER COMPOSITE HIGH TEMPERATURE CERAMIC SUPERCONDUCTORS BY PRECIPITATION

BACKGROUND OF THE INVENTION

This invention relates to a method for improving the performance of high temperature superconducting materials.

INTRODUCTION TO THE INVENTION

We are working with high temperature superconducting materials, in particular, YBCO (yttrium-barium-copper oxide) ceramic superconductors.

Indicia of improvement of performance of these materials include inter alia:

(1) enhancement of their critical current density (Jc);
(2) increases in their critical temperature (Tc);
(3) decreases in their normal state resistivity; and/or
(4) improvement in their durability and workability.

In accordance with these desiderata, it is known that the performance of YBCO ceramic superconductors can be significantly improved by the formation of a composite of the ceramic with silver or silver oxide.

Researchers have claimed that such composites can provide a substantial enhancement (up to fifteenfold) of the critical current density (see Appendix, Reference 1); a modest increase in the critical temperature (References 2, 3); a substantial decrease in normal state resistivity (References 2, 3); and, a noteworthy improvement in ductility and workability (Reference 4). Moreover, it has been claimed that such composites can comprise an addition of up to 60% silver by weight, without any significant degradation of bulk superconducting properties (Reference 3).

Some composite samples have been reported to exhibit very pronounced magnetization (M) versus applied magnetic field (H) hysteretic behavior, suggesting the presence of strong magnetic flux pinning centers in a composite (Reference 8). The existence of strong flux pinning, in turn, is thought to be an important condition for obtaining a high current density (Jc), and producing stable magnetic levitation or suspension (References 9, 10).

SUMMARY OF THE INVENTION

We restate, in brief, the above information. We suggest that the performance of high temperature superconducting materials, for example, YBCO ceramic superconductors, may be improved by the formation of a composite with silver or silver oxide. We now turn our attention, more precisely, to two extant methods for forming or preparing the composite.

In a first method, a silver/ceramic composite is typically formed or prepared by mechanically blending silver or silver oxide powder with an oxide superconductor powder, or with a mixture of superconductor precursor oxide powders, in appropriate ratios, and then thermally treating the blend at 850°–950° C., in air or oxygen, for 16 hours or more, with or without a subsequent annealing step (References 3, 4, 7, 8). A subsequent laboratory-scale mixing process typically involves mechanically grinding the powders in a roller or jar mill, or manually with a mortar and pestle. Typically, this process cycle of thermal treatment and milling must be oft repeated.

In a second method, a silver/ceramic composite may be prepared by melting elemental Y, Ba, Cu, and Ag in an arc furnace (Reference 11). A resulting ingot is cold rolled to thin foil shapes, which are then subjected to a number of heat treatments, to achieve oxidation.

We have recognized that both the first and second methods of forming the silver composite, although typical methodologies, may include pervasive deficiencies, which deficiencies can stymie or even thwart the sought for improvements and advantages of a silver composite superconductor.

These deficiencies can be summarized by the concept of chemical and microstructural "heterogeneity", wherein the cited methods may lead to an incomplete mixing, thus forming, after sintering, a heterogeneous ceramic superconductor. (We will subsequently show, in sharp contrast, that a desired method produces a homogeneous ceramic superconductor.)

We now expand upon this concept of heterogeneity, as empirical experiment permits.

A composite superconductor prepared by the methods 1, 2 supra, is such that the silver is typically located interstitially (Reference 1), in the boundaries between the ceramic superconductor grains, or as isolated particles (Reference 2), rather than as a homogeneous chemical substitution for copper in the superconductor crystal lattice (Reference 5). It is important for the retention of the superconductivity in these ceramics that the silver not replace copper in the lattice.

The addition of the silver or silver oxide by the methods 1, 2 supra may produce changes in the ceramic microstructure of sintered compacts of the superconductor powder. For example, there may be a (deleterious) decrease in porosity (References 3, 6), and/or an apparent (and deleterious) increase in the size and platelet-shape of the ceramic grains (i.e., an increased tendency for heterogeneity).

Furthermore, since the average particle size produced by the attrition process subsumed by the two methods supra, is relatively larger, the use of higher firing temperatures, as well as longer processing times, may be typically (if disadvantageously) required.

In net, the prior art methods 1, 2 supra promote segregation of the metallic silver, as well as discontinuous ceramic grain growth, thereby resulting in a non-uniform (heterogeneic) grain microstructure, in a final sintered ceramic superconductor.

We have now discovered a novel method for realizing a more uniform (homogeneous) distribution of silver around the ceramic superconductor grains in a sintered composite.

In summary, the novel method of the present invention prepares or forms a silver/ceramic composite from a precursor powder that has been obtained, in turn, by chemical coprecipitation from an aqueous solution containing silver ions, as well as the other required metal ions. This coprecipitation process can produce a finely divided precursor powder in which the metal oxides are intimately, hence homogeneously, mixed.

The novel method has an important advantage of retaining all the virtues of a process subsuming formation of a composite of a ceramic with silver, including enhanced critical current densities and increases in critical temperature, while eliminating and avoiding the problem of heterogeneity, as shown above to be an offsetting feature of the typical prior art methodologies. Other advantages of the novel method of the present invention, are disclosed below.

Accordingly, we now disclose a method for preparing a silver/superconducting ceramic composite comprising the steps of:

1) forming an aqueous solution of metal salts including silver and comprised of the metals that can constitute part of the ceramic and of pyrolyzable counter anions, said metal salts being present in a stoichiometric proportion necessary to form said composite ceramic;

2) forming an aqueous solution comprising an alkaline hydroxide and carbonate anions;

3) mixing said solutions together for yielding a coprecipitate with a cation ratio required for a final composite superconducting ceramic;

4) filtering the step 3) coprecipitate;

5) washing the step 4) coprecipitate until its filtrate pH is less than 10;

6) drying the step 5) washed coprecipitate for producing a dried composite precursor;

7) calcining the step 6) precursor for producing a silver composite ceramic; and 8) milling the calcined composite powder comprising two phases, a first silver phase and a second Y-Ba-Cu-O phase, said two phases being of uniform distribution and each phase being present in grains smaller than 20 $\mu$m.

BRIEF DESCRIPTION OF THE DRAWING

The invention is illustrated in the accompanying drawing, in which.

DETAILED DESCRIPTION OF THE INVENTION

Figure 1:
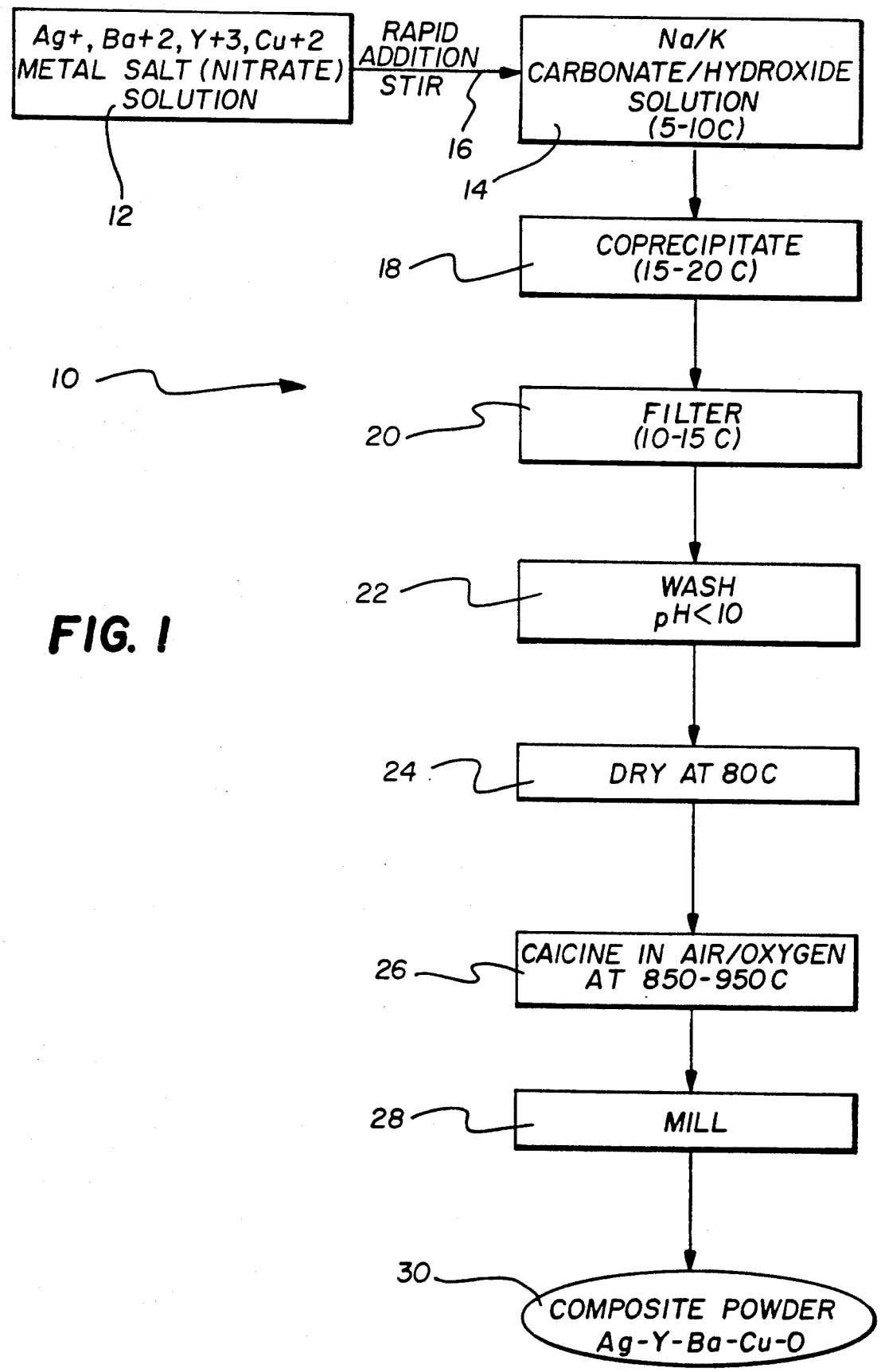
FIG. 1 shows a flowchart of the steps of the method of the present invention.

The novel coprecipitated precursor method of the present invention, summarized above, may be used to prepare a composite powder comprising silver or silver oxide and Y-Ba-Cu oxide high temperature ceramic superconductor. An illustrative flowchart 10 of the overall coprecipitation process is shown in FIG. 1. We now work through the FIG. 1 flowchart 10.

The Flowchart

In FIG. 1, a step 1 (box 12) shows that an aqueous solution comprising the yttrium, barium, copper, and silver ions, in an illustrative ratio 1:2:3:2 (for 25% w/w Ag in the composite), may be prepared using hydrated or anhydrous nitrate salts. The total metal ion concentration is preferably adjusted to approximately 1 Molar.

The metal salt solution (box 14) (pH: 2-3) at room temperature is rapidly added, (step 2), with vigorous stirring (step 3, arrow 16) to a chilled (preferably 5°-10° C.) aqueous solution comprising a combination of sodium (or potassium) hydroxide and sodium (or potassium) carbonate, in amounts adequate to ensure complete precipitation of the metals, and to maintain pH 10-11 of the solution after addition is completed.

The formed precipitate (box 18) may be collected by either filtration (step 4, box 20) or centrifugation, and is preferably thoroughly washed (step 5, box 22) with deionized water to remove all the residual alkali metal ions. The pH of the filtrate is continuously monitored during washing. Washing is discontinued when the pH value is approximately 10. This is necessary in order to minimize the loss of barium, which is partially soluble at greater than 7 pH.

The washed coprecipitate is preferably oven dried (step 5) at preferably 80° C. in air (box 24).

Next, the dried coprecipitate is ground to a free-flowing powder (preferably 100 mesh), and calcinated (step 7, box 26) in a stream of dry air or oxygen for approximately 6 hours at 850°-900° C., to generate the high temperature superconductor phase.

The calcined powder is preferably allowed to cool slowly (in the furnace) to room temperature in an air or oxygen stream to ensure that the full oxygen stoichiometry is attained.

The black, friable solid product may be removed from the furnace and further ground (step 8, box 28) to give a free-flowing composite powder (box 30).

Measurements

The final composite material may be characterized using a variety of analytical techniques.

Phase purity of the ceramic superconductor may be assessed by X-ray powder diffraction analysis. This technique can be supplemented by differential thermal analysis (DTA), to identify small quantities of low melting point impurity phase(s).

Another thermal analysis technique, thermogravimetric analysis (TGA), can be used to determine the oxygen stoichiometry of the ceramic superconductor phase.

The metals analysis may be performed by either inductively coupled plasma (ICP) emission spectroscopy, or atomic absorption (AA) spectroscopy.

The specific surface area of the composite powder may be determined by the B.E.T. multipoint nitrogen adsorption technique.

The ceramic microstructure of the sintered composite can be observed by scanning electron microscopy, and the qualitative elemental composition of individual grains or small regions can be determined using energy dispersive X-ray spectroscopy (EDX).

A vibrating sample magnetometer equipped with a liquid helium cryostat may be used to determine the magnetic properties of the superconducting composite. Magnetization may be measured as a function of temperature at a low constant applied magnetic field and the critical temperature, the critical temperature transition width, and superconductivity fraction SCF (an estimate of the fraction of the bulk sample that is superconducting) may be determined for the final composite material. Also, magnetization may be measured as a function of the applied magnetic field at a constant temperature and the resulting hysteresis loop. The area enclosed in the loop is indicative of the amount of magnetic flux pinning in the composite material. This also allows an estimate of the intragranular critical current density in the composite material.

Physical property measurements such as Knoop hardness can be measured on a polished section of a pressed pellet of the bulk sintered composite.

Example

The coprecipitated precursor for the preparation of a silver/Y-Ba-Cu oxide superconductor composite containing 25% w/w AG was prepared as follows.

The Ba $(NO_3)_2$ (39.22 g) was dissolved separately with heating and stirring in 0.5 L deionized water. The $Y(NO_3)_3 \cdot 6H_2O$ (28.72 g), $Cu(NO_3)_2 \cdot 2.5H_2O$ (52.33 g), and $AgNO_3$ (25.78 g) were dissolved in another 0.25 L deionized water.

The solution containing the Y, Cu, and Ag nitrates was added slowly to the Ba nitrate solution at room temperature. The combined metal nitrate solution was added quickly to a chilled (5°–10° C.), rapidly stirred solution containing $Na_2CO_3 \cdot H_2O$ (62.00 g) and NaOH (27.00 g) in 1 L deionized water.

An instantaneous precipitation took place, and the resulting olive-green slurry was stirred for an additional 15 minutes to ensure completeness of the precipitation process.

The dark green solid was collected by filtration and washed with 2 L aliquots of deionized water, until the filtrate pH was approximately 10.0.

The filtercake was placed in a drying oven at 80° C. The resulting dark gray product (81.8 g) was ground to a gray-green powder with a mortar and pestle.

Metals analysis by ICP was performed on a sample of the dried coprecipitate: %Ba=24.8; %Cu=16/8; %Ag=19.6 (w/w); Y:Ba:Cu:Ag=1.03:2.00:2.92:2.01 (Target=1:2:3:2).

A 10.6 g sample of the above dried coprecipitate was placed in an alumina (99.8%) combustion boat, calcined in static air at 850° C. for 6 hours, and allowed to cool slowly to room temperature in the furnace. 8.5 g (80% yield) of a lightly sintered black powder was obtained.

Figure 2:
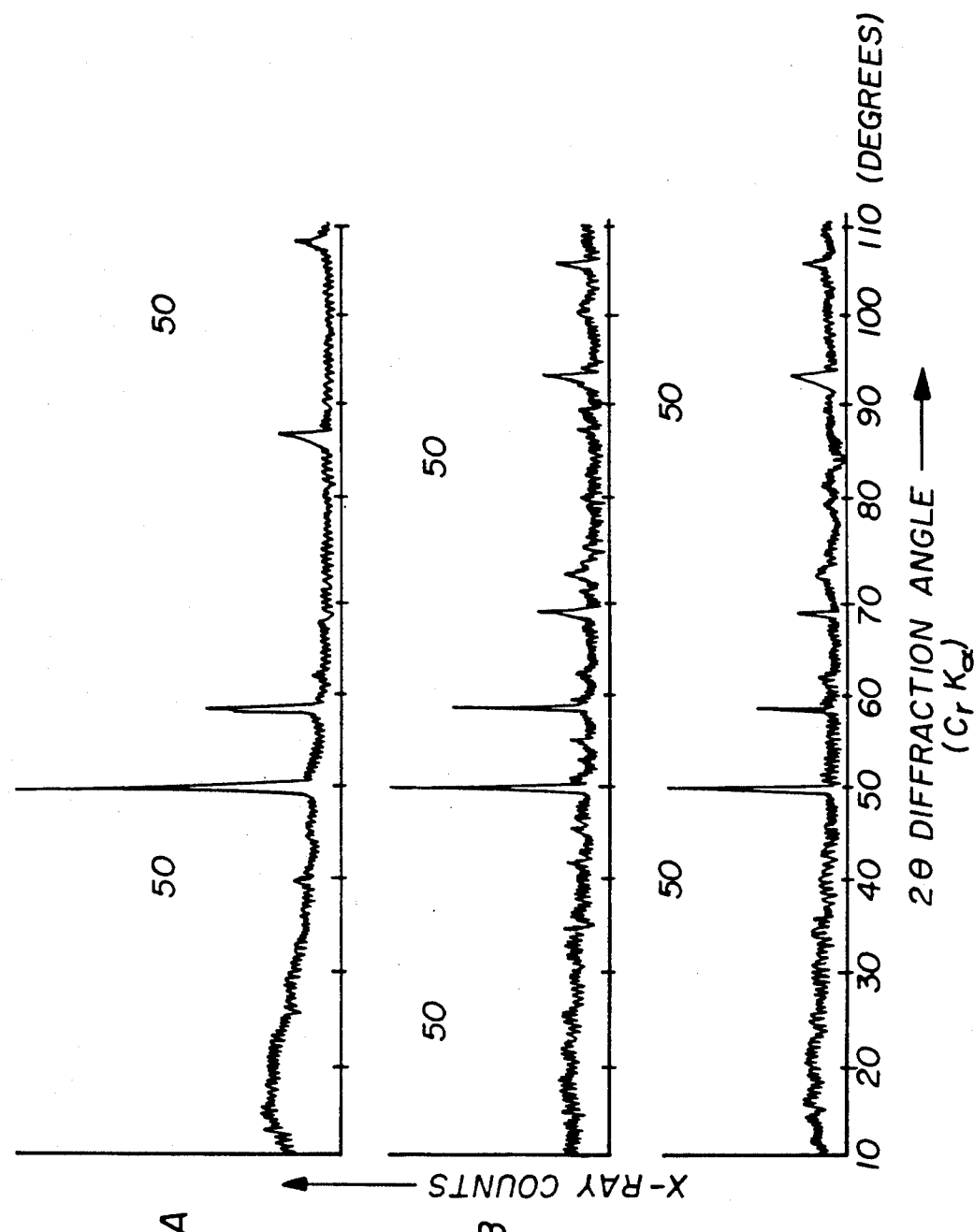
FIGS. 2a-c show X-ray diffraction patterns comparing an Example of the present invention to prior methodologies.

The X-ray powder diffraction pattern of the calcined product was measured, and the major peaks characteristic of silver oxide, as well as several weaker peaks corresponding to those expected for $BaY_2Cu_3O_{7-x}$, were observed. A comparison of the X-ray diffraction patterns is shown in FIG. 2. The specific surface area of the powder was determined to be 0.2 $M^2/g$. Metals analysis by ICP was performed on a sample of the composite powder: %Ba=31.5; %Y=10.6; %Cu=21.5; %Ag=24.2 (w/w); Y:Ba:Cu:Ag=1.04:2.00:2.95:1.96.

Another 10.0 g sample of the dried coprecipitate was calcined at 900° C. for 6 hours in flowing oxygen. The analytical results were very similar to those for the sample calcined in air.

Figure 3:
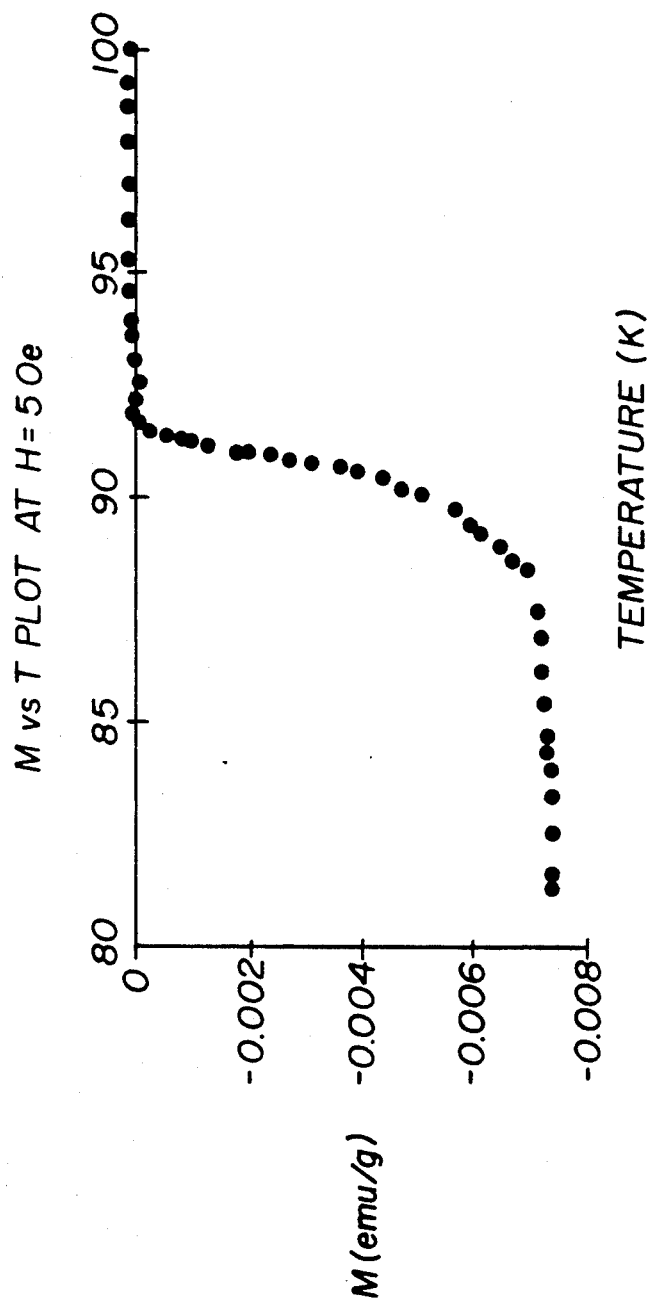
FIG. 3 shows a magnetization versus temperature plot for a sample derived from an Example of the present invention.

A small quantity of the calcined powder was pressed at room temperature to form $\frac{1}{4}''$ diameter and less than 1/16" thick pellets, at about 6000 psi total pressure. The pellet was sintered in a surface for 3 hours at 900° C. in flowing oxygen, and allowed to cool in the furnace to room temperature. Samples in typical size 6 mm×3 mm×1.5 mm were cut from these sintered pellets and were used for superconducting and magnetic properties characterization. The magnetization vs. temperature plot for such a sample is shown in FIG. 3. The Tc for this sample was approximately 92° K. and the transition width was approximately 3.3°. This is very similar to the values generally seen for pure YBCO samples.

Figure 4:
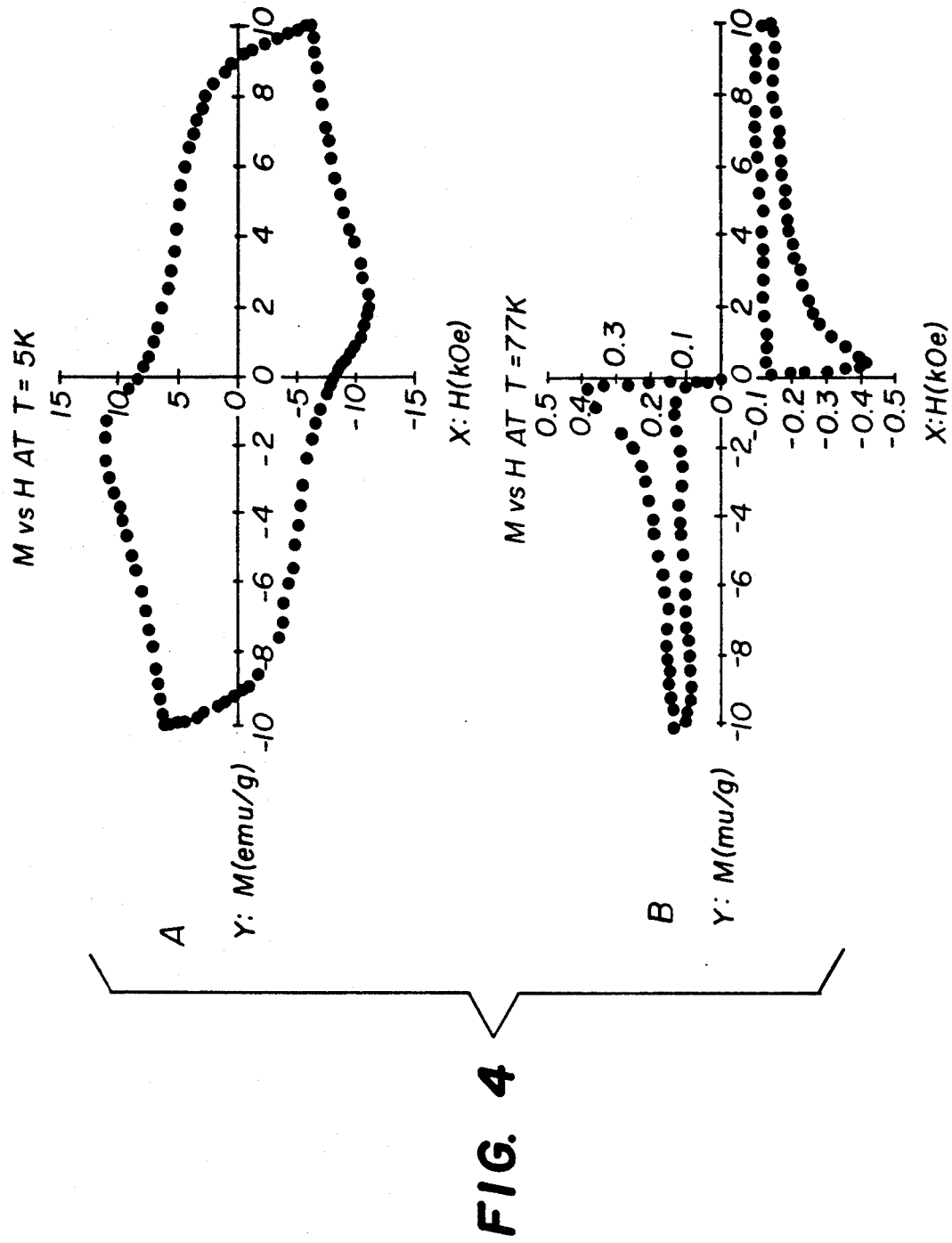
FIGS. 4a, b show hysteresis loops generated from samples derived from an Example of the present invention.

We also measured the hysteresis loops at two different temperatures (77K, B.P. of liquid nitrogen and 5K, near the B.P. of liquid helium). Typical hysteresis loops are shown in FIG. 4. The area of the loops indicate the flux pinning in the sample. As expected, the amount of flux pinning is much larger at 5K than at 77K.

Figure 5A:
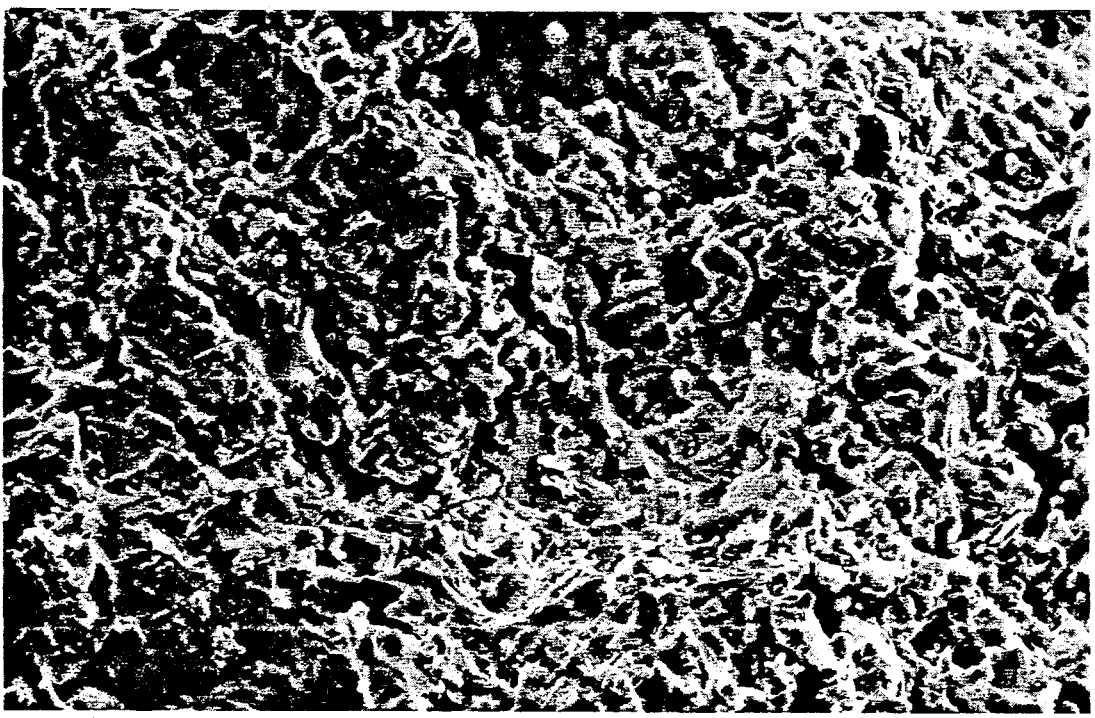
FIGS. 5a, b show scanning electron microscope (SEM) micrographs of calcined powder samples generated from an Example of the present invention.
Figure 5B:
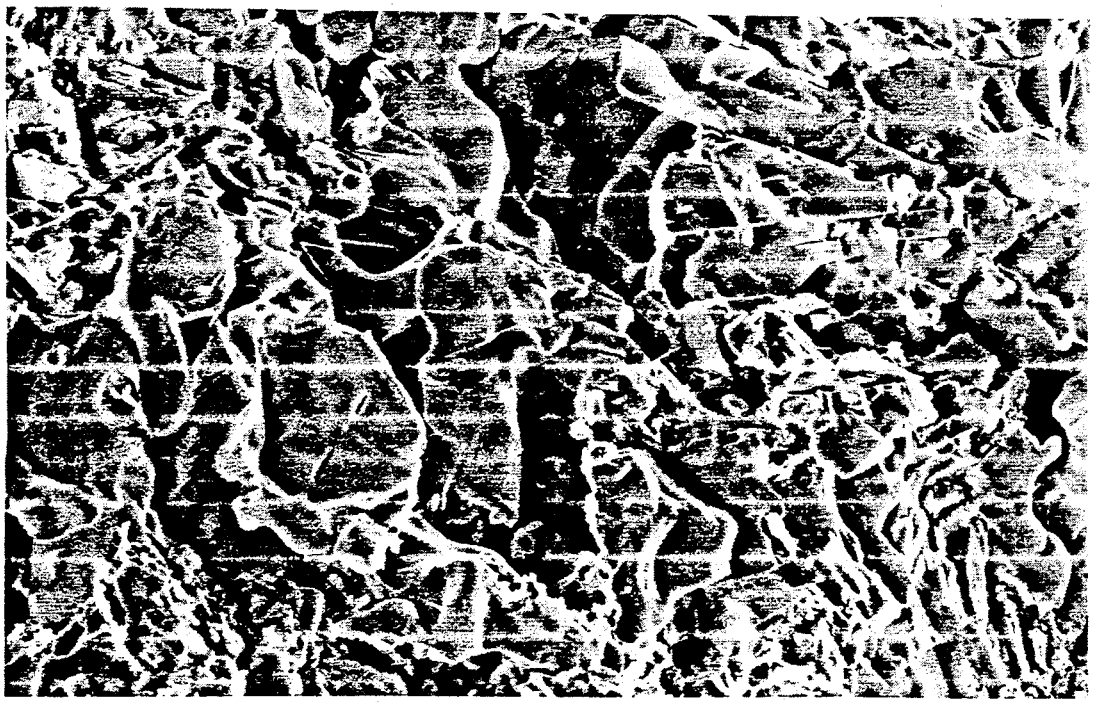

Two scanning electron microscope (SEM) micrographs of the calcined powder samples are shown in FIG. 5. In FIG. 5a, micrograph of a 25% w/w $Ag_2O$+YBCO prepared by our chemical coprecipitation technique is shown under a magnification of 510 X. In FIG. 5b, micrograph of a 30% w/w $Ag_2O$+YBCO prepared by the conventional mixing and thermal treatment process is shown under the same magnification. It is evident from these figures that the composite sample prepared by our chemical coprecipitation method is much more homogeneous, even at such finer scale as indicated in the micrographs, than a conventionally prepared composite.

Purview of Method

In addition to the silver/Y-Ba-Cu oxide ceramic superconductor composites, the present coprecipitation method can be used to prepare silver composites with Bi-Sr-Ca-Cu oxide and analogous thallium oxide-based families of higher temperature ceramic superconductors as well. The preparation of lead-stabilized Bi-Sr-Ca-Cu oxide superconductor powders is also possible using this coprecipitation method. The technique has been demonstrated for several Bi-Sr-Ca-Cu oxide superconductor powders (without lead). It is expected that this coprecipitation technique is generally useful for preparing other types of metal or metal oxide/ceramic composites which require careful control of both chemical homogeneity and ceramic microstructure.

APPENDIX

Background references for the method of the present invention are now set forth. The disclosures of each of these references are incorporated by reference herein.

1. Lue J. T., Kung, J. H., Yen H. H., Chen. Y. C., Wu P. T., Mod. Phys. Lett., B, 2(2), 589-95 (1988).
2. Sherwood R. C., Jin S., Tiefel T. H., VanDover R. B., Fastnacht R. A., Yan M. F., Rhodes W. W., Mat. Res. Soc. Symp. Proc. Vol. 99, 503-6 (1988).
3. Plechacek V., Landa V., Blazek Z., Sneidr J., Trejbalova Z., Cermak M., Physica C 153-5, 878-9 (1988).
4. R. Prasad, Soni N. C., Mohan A., Khera S. K., Nair K. U., Gupta C. K., Tomy C. V., Malik S. K. et al., Mater. Lett., 7(1,2), 9-12 (1988).
5. Cohen D., Schwartz M., Reich S., Felner I., Inorg. Chem., 26, 3653-5 (1987).
6. Peterson G. G., Weinberger B. R., Lynds L., Krasinski H. A., J. Mater. Res., 3(4), 605-9 (1988).
7. J. H. Kung., Yen H. H., Chen Y. C., Wang C. M., Wu P. T., Mat. Res. Soc. Symp. Proc., Vol. 99, 785-8 (1988).
8. Huang C. Y., Shapira Y., McNiff E. J., Peters P. N., Schwartz B. B., Wu M. K., Shull R. K., Chiang C. K., Mod. Phys. Lett. B, 2(7), 869-74 (1988).
9. Brandt E. H., Science, Vol. 243, 349-355 (1989).
10. Peters P. N., Sisk R. C., Urban E. W., Huang C. Y., Wu M. K., Appl. Phys. Lett., 52(24), 2066-7 (1988).
11. Early E. A., Seaman C. L., Maple M. B., Simnad M. T., Physica C 153-5, 1161-2 (1988).

What is claimed is:

1. A method for preparing a silver/superconducting ceramic composite, comprising the steps of:

1) forming an aqueous solution of metal salts including silver and comprised of the metals that can constitute part of the ceramic and or pyrolyzable counter anions, said metal salts being present in a stoichiometric proportion necessary to form said composite ceramic;

2) forming an aqueous solution comprising an alkaline hydroxide and carbonate anions;

3) mixing said solutions together for yielding a coprecipitate with a cation ratio required for a final composite superconducting ceramic;

4) filtering the step 3) coprecipitate;

5) washing the step 4) coprecipitate until its filtrate pH is less than 10;

6) drying the step 5) washed coprecipitate for producing a dried composite precursor;

7) calcining the step 6) precursor for producing a silver composite ceramic; and 8) milling the calcined composite powder comprising a uniform distribution of silver around the ceramic superconductor grains.

2. The method according to claim 1, wherein step 3 comprises rapidly and completely mixing said solutions together.

3. The method according to claim 1, wherein step 3 comprises yielding the coprecipitate by chilled the solution to a temperature from 15° C. to 20° C.

* * * * *